United States Patent [19]
Hashimoto

[11] Patent Number: 6,001,711
[45] Date of Patent: Dec. 14, 1999

[54] PROCESS OF FABRICATING SEMICONDUCTOR DEVICE HAVING GETTERING SITE LAYER BETWEEN INSULATING LAYER AND ACTIVE SEMICONDUCTOR LAYER

[75] Inventor: Takasuke Hashimoto, Tokyo, Japan

[73] Assignee: NEC Corporation, Tokyo, Japan

[21] Appl. No.: 09/037,322

[22] Filed: Mar. 9, 1998

[30] Foreign Application Priority Data

Mar. 12, 1997 [JP] Japan .................................. 9-057732

[51] Int. Cl.$^6$ .................................................. H01L 21/326
[52] U.S. Cl. ........................ 438/473; 438/407; 438/455; 438/459; 438/517; 438/526
[58] Field of Search .................................... 438/473, 407, 438/455, 459, 517, 526

[56] References Cited

FOREIGN PATENT DOCUMENTS

| 58-60544 | 4/1983 | Japan . |
| 4-239153 | 8/1992 | Japan . |
| 6-163862 | 6/1994 | Japan . |

OTHER PUBLICATIONS

"Anomalous Leakage Current Reduction By Ramping Rate Control in MEV Implantation", by Mat. Res. Soc. Symp. Proc. vol. 396, 1996 Materials Research Society.

*Primary Examiner*—Jey Tsai
*Assistant Examiner*—Alexander G. Ghyka
*Attorney, Agent, or Firm*—J. Warren Whitesel; Laff, Whitesel & Saret, Ltd.

[57] ABSTRACT

Phosphorous ion is implanted into an SOI substrate under the conditions that the concentration is maximized in the upper silicon layer of the SOI substrate so as to forming a heavily-doped damaged layer, and the heavily-doped damaged layer is partially cured through a lamp annealing so as to concurrently form a heavily-doped buried layer and a gettering site layer.

10 Claims, 7 Drawing Sheets

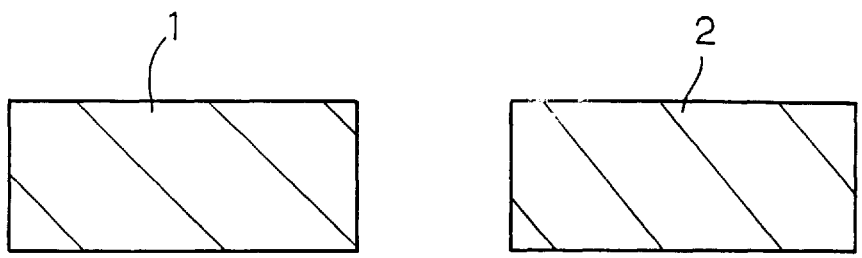
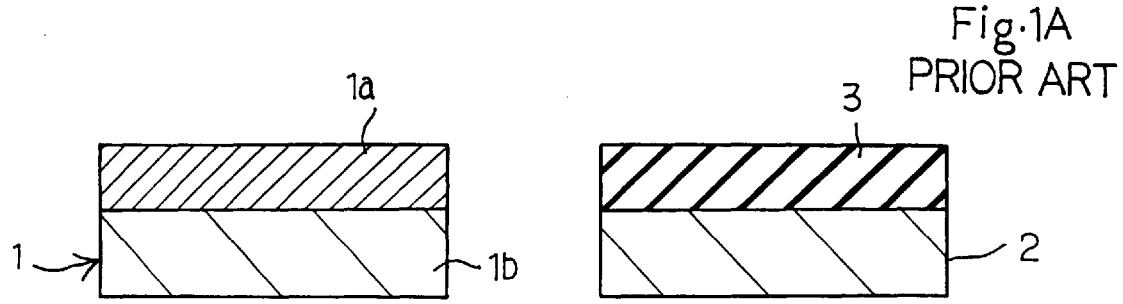
Fig.1A PRIOR ART
Fig.1B PRIOR ART
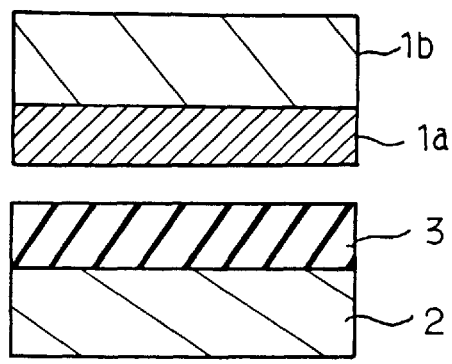
Fig.1C PRIOR ART
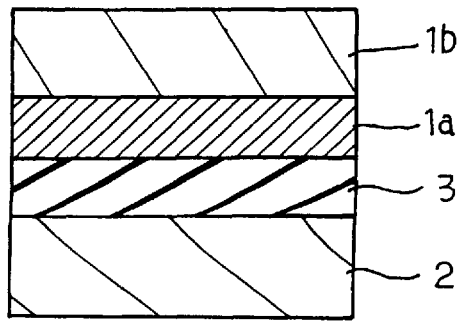
Fig.1D PRIOR ART

PROCESS OF FABRICATING SEMICONDUCTOR DEVICE HAVING GETTERING SITE LAYER BETWEEN INSULATING LAYER AND ACTIVE SEMICONDUCTOR LAYER

FIELD OF THE INVENTION

This invention relates to a semiconductor fabrication technology and, more particularly, to a process of fabricating a semiconductor device having a gettering site layer between an insulating layer and an active semiconductor layer.

DESCRIPTION OF THE RELATED ART

Crystal defects and metallic impurities have harmful influences on circuit components of an integrated circuit fabricated on an active semiconductor layer. The harmful influences are removed from the active semiconductor layer through the gettering treatment. Thus, the gettering treatment is indispensable step in a process of fabricating a semiconductor device. Various gettering technologies have been known to a person skilled in the art. For example, when an integrated circuit is fabricated on a single crystalline silicon wafer, the back surface portion is intentionally damaged, and the damages make the impurities innocuous. The damages are, by way of example, introduced through a mechanical abrasion, a laser beam radiation or a thermal cycle.

The prior art gettering technologies are effective against the crystal defects and the metallic impurities for circuit components fabricated on a semiconductor wafer. However, the prior art gettering technologies are not available for an integrated circuit fabricated on a silicon-on-insulator substrate, because the insulating layer interrupts the desirable influences of the intentional damages. In other words, the intentional damages can not make defects and contaminant in an active semiconductor layer innocuous.

One of the prior art gettering technologies for a silicon-on-insulator substrate is disclosed in Japanese Patent Publication of Unexamined Application No. 6-163862, and FIGS. 1A to 1D illustrates the prior art gettering technology. The prior art process starts with preparation of two silicon substrates 1 and 2 (see FIG. 1A). The silicon substrate 1 provides an active layer, and circuit components are integrated on the active layer. On the other hand, the silicon substrate 2 supports the active layer as will be described hereinbelow.

Phosphorous is ion implanted into a surface portion of the silicon substrate 1 at dosage of at least $1\times10^{15}$ atoms/cm$^2$. Then, a heavily-doped impurity layer 1a is formed on a single crystalline silicon layer 1b (see FIG. 1B), and ranges 1 micron to 5 microns thick. On the other hand, a silicon oxide layer 3 is formed on the other silicon substrate 2 as shown in FIG. 1B.

The heavily-doped impurity layer 1a is opposed to the silicon oxide layer 3 (see FIG. 1C), and the heavily-doped impurity layer 1a and the silicon oxide layer 3 are bonded to each other through heat treatment at 1000 degrees in centigrade as shown in FIG. 1D.

The first prior art process disclosed in Japanese Patent Publication of Unexamined Application No. 6-163862 encounters a problem in that the heavily-doped impurity layer 1a is liable to peel from the silicon oxide layer 3 due to poor bonding strength, and, accordingly, the production yield is low.

In order to overcome the problem inherent in the first prior art process, another prior art process is disclosed in Japanese Patent Publication of Unexamined Application No. 4-239153, and FIGS. 2A to 2C illustrate the second prior art process. The second prior art process aims at increasing the production yield. The second prior art process starts with preparation of a silicon substrate 10, and a silicon oxide layer 11 is thermally grown to 1 micron thick on a surface portion of the silicon substrate 10. Another silicon substrate 12 is prepared, and is brought into contact with the silicon oxide layer 11. The resultant structure is heated to 1000 degrees in centigrade, and the silicon substrate 12 is bonded to the silicon oxide layer 11 as shown in FIG. 2A.

The silicon substrate 12 is polished until 1.5 microns thick (see FIG. 2B), and arsenic is ion implanted into the silicon substrate 12. The acceleration energy is regulated in such a manner that the arsenic concentration is maximized in the silicon oxide layer 11. The resultant structure is treated with heat for activating the ion-implanted arsenic, and the activated arsenic forms a heavily-doped buried layer 13 between the silicon oxide layer 11 and a single crystal silicon layer 14 as shown in FIG. 2C. The single crystal silicon layer 14 serves as an active layer, and a collector region, a base region and an emitter region may be formed in the active layer 14.

A third prior art process is disclosed in Japanese Patent Publication of Unexamined Application No. 58-60544, and FIGS. 3A to 3D illustrate the third prior art process. The process starts with preparation of a silicon substrate 20. A silicon oxide layer 21 is formed on a surface of the silicon substrate 20, and polysilicon is deposited over the entire surface of the silicon oxide layer 21. As a result, the silicon oxide layer 21 is covered with a polysilicon layer 22.

Oxygen is heavily ion implanted into the polysilicon layer 22 as shown in FIG. 3A. Subsequently, high-power laser beam is radiated to the entire surface of the oxygen-doped polysilicon layer 22, and the polysilicon is recrystallized into single crystalline silicon during the laser annealing. As a result, the polysilicon layer 22 is converted to a single crystalline silicon layer 23 as shown in FIG. 3B. The oxygen ion is diffused over the single crystalline silicon layer 23 during the laser annealing.

A laser beam is radiated to the single crystalline silicon layer 23 under difference conditions from the above described laser beam radiation, and the oxygen is diffused from a surface portion of the single crystalline silicon layer 23 to the atmosphere. Then, the surface portion becomes an oxygen-free layer 24 as shown in FIG. 3C.

Finally, the single crystalline silicon layer 23 is annealed at low temperature in non-oxidizing atmosphere, and an intentionally defective silicon layer 25 and a non-defective layer 26 are created as shown in FIG. 3D.

The second prior art process improves the bonding strength of the substrate and, accordingly, the production yield. However, the bipolar transistor formed in the active layer 14 encounters a problem in a large amount of leakage current between the base region and the collector region. Another problem is large collector resistance due to the poor dopant concentration of the heavily doped n-type buried layer 13.

The substrate fabricated through the third prior art process is free from the peeling, and, accordingly, the third prior art process also overcomes the problem inherent in the first prior art process. However, the third prior art process requires the laser radiation twice, and the laser radiation makes the third prior art process complicated.

SUMMARY OF THE INVENTION

It is therefore an important object of the present invention to provide a process, which is simple and forms a heavily doped layer used as a low-resistive layer between an insulating layer and an active layer.

In accordance with one aspect of the present invention, there is provided a process of fabricating a semiconductor device comprising the steps of a) preparing a semiconductor structure having an insulating layer sandwiched between a first semiconductor layer and a second semiconductor layer, b) implanting a dopant impurity ion into the semiconductor structure under the conditions that the concentration of the dopant impurity is maximized in the first semiconductor layer so as to form a heavily-doped damaged layer therein and c) partially annealing the heavily-doped damaged layer so as to concurrently form a heavily-doped semiconductor layer and a gettering site layer in the first semiconductor layer.

BRIEF DESCRIPTION OF THE DRAWINGS

The features and advantages of the process will be more clearly understood from the following description taken in conjunction with the accompanying drawings in which:

FIGS. 1A to 1D are cross sectional views showing the prior art process disclosed in Japanese Patent Publication of Unexamined Application No. 6-16386;

DESCRIPTION OF THE PREFERRED EMBODIMENTS

First Embodiment

Figure 2A:
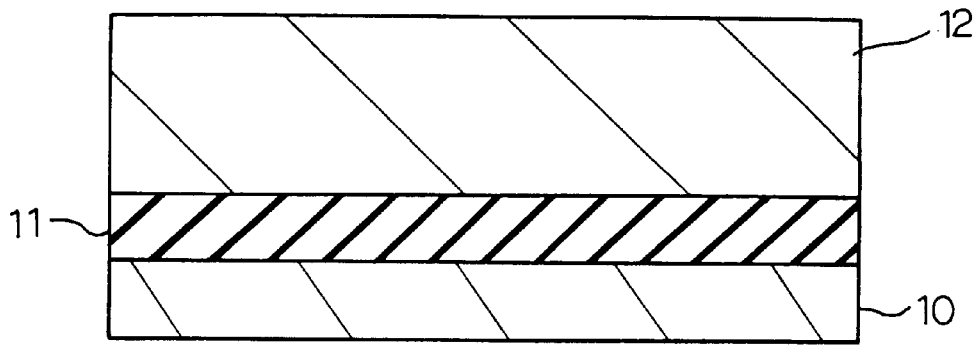
FIGS. 2A to 2C are cross sectional views showing the prior art process disclosed in Japanese Patent Publication of Unexamined Application No. 4-239153.
Figure 2B:
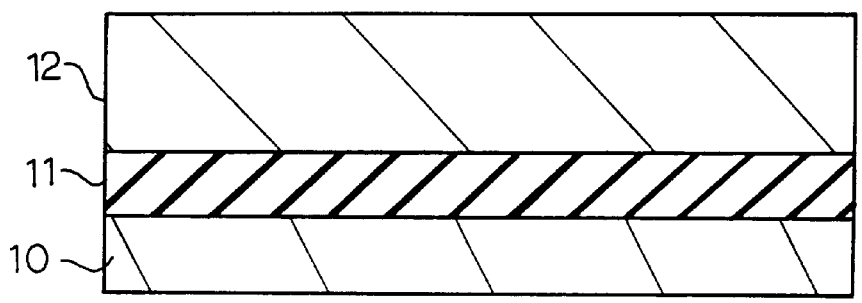
Figure 2C:
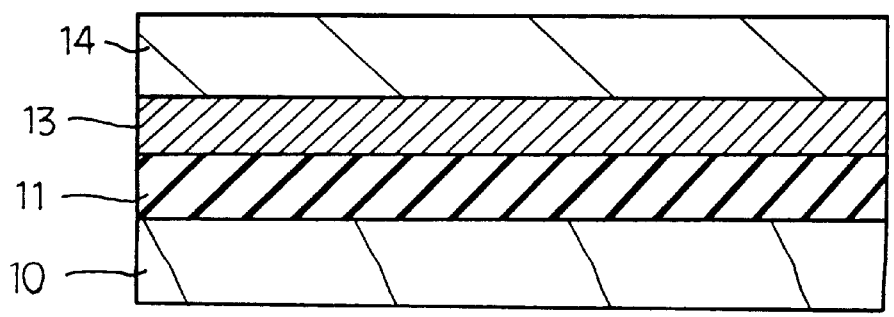
Figures 3A, 3B, 3C, 3D:
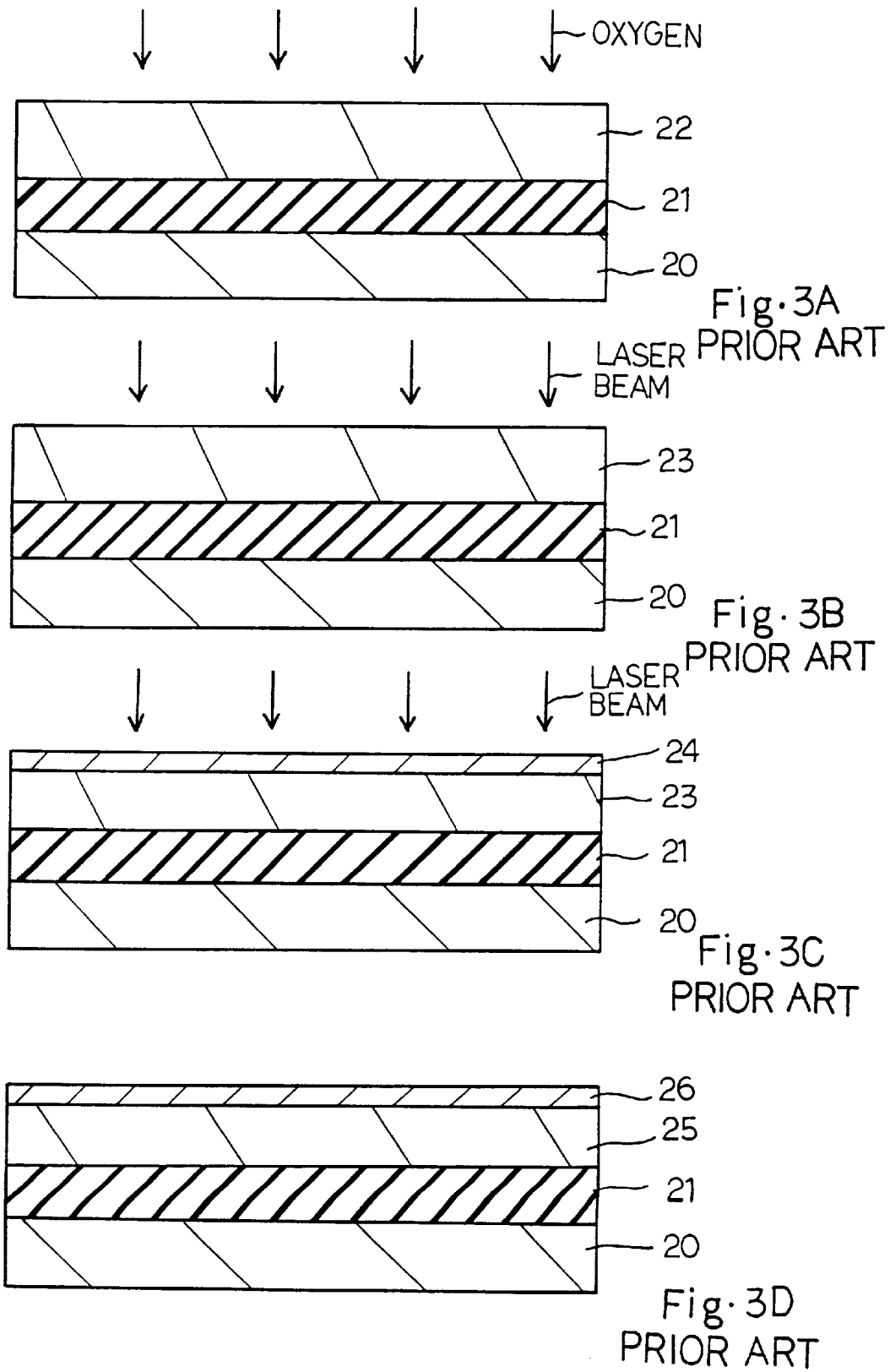
FIGS. 3A to 3D are cross sectional views showing the prior art process disclosed in Japanese Patent Publication of Unexamined Application No. 58-60544.
Figure 4A:
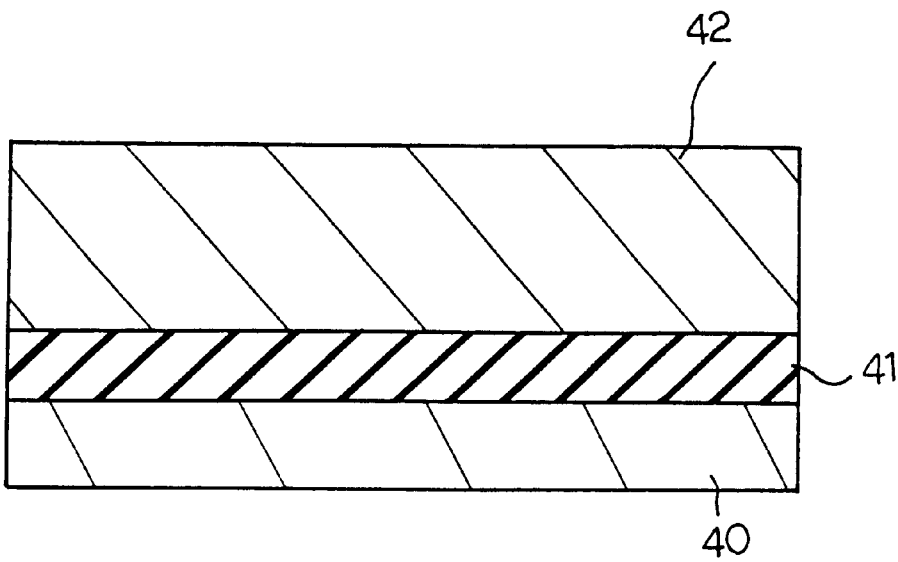
FIGS. 4A to 4C are cross sectional views showing a process of fabricating a semiconductor device according to the present invention.
Figure 4B:
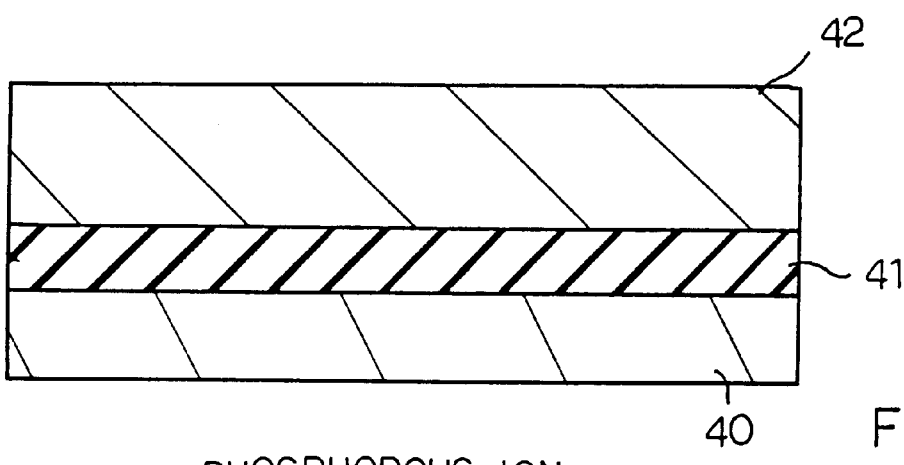
Figure 4C:
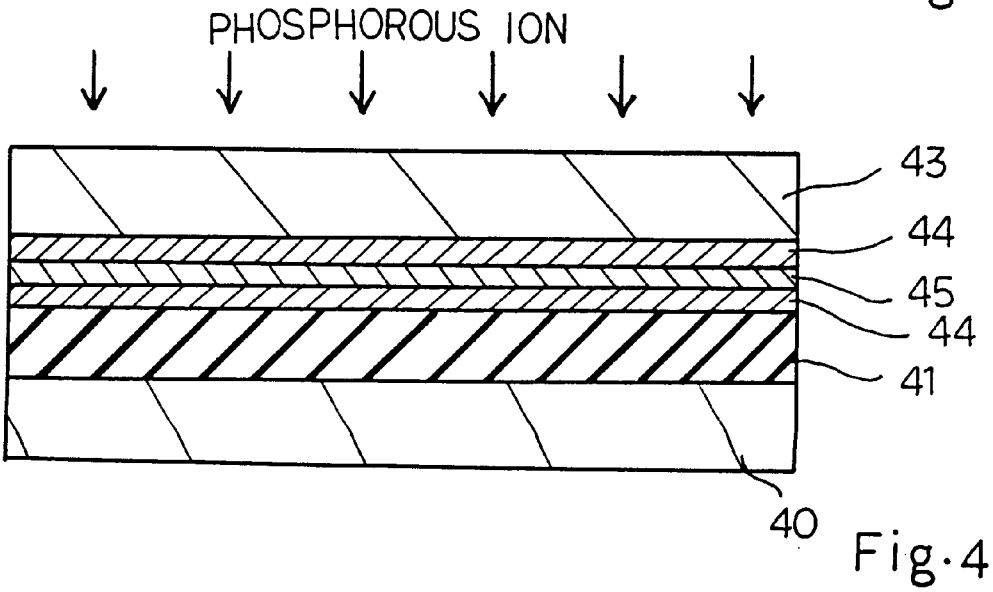

FIGS. 4A to 4C illustrate a process of fabricating a semiconductor device embodying the present invention. The process starts with preparation of a silicon substrate 40. The silicon substrate 40 is thermally oxidized so as to grow a silicon oxide layer 41 of 1 micron thick. An n-type single crystalline silicon substrate 42 is opposed to the silicon oxide layer 41, and is brought into contact with the silicon oxide layer 41. The resultant structure is heated to 1000 degrees in centigrade, and the n-type single crystalline silicon substrate 42 is adhered to the silicon oxide layer 41 as shown in FIG. 4A.

The n-type single crystalline silicon substrate 42 is polished, and the thickness is decreased to 1.5 microns. The silicon substrate 40, the silicon oxide layer 41 and the n-type single crystalline silicon substrate 42 as a whole constitute an SOI (Silicon-On-Insulator) substrate as shown in FIG. 4B.

Subsequently, phosphorous is ion implanted into the n-type single crystalline silicon substrate 42, and forms a heavily-doped n-type impurity layer between the silicon oxide layer 41 and an n-type active layer 43. Crystal defects are concentrated around a peak of the ion-implanted dopant concentration. For this reason, the acceleration energy is regulated in such a manner that the dopant concentration is maximized in the n-type single crystalline silicon substrate 42. In this instance, the n-type single crystalline silicon substrate 42 is 1.5 microns thick after the polishing, and the acceleration energy is regulated to 1000 KeV so as to adjust the average projection range to 1 micron. In this instance, dosage is $5 \times 10^{14}$ atoms/cm$^2$. However, the dosage is not limited to $5 \times 10^{14}$ atoms/cm$^2$. The minimum dosage is equal to $1 \times 10^{14}$ atoms/cm$^2$, because crystal defect hardly occurs under dosage less than the minimum value. On the other hand, if the dosage is of the order of $1 \times 10^{16}$ atoms/cm$^2$, the introduced dopant impurity increases the concentration around a p-n junction formed in the n-type active layer 43, and deteriorates the transistor characteristics. For this reason, when a heavily-doped buried layer, which is described hereinlater, is used for a bipolar transistor, the dosage preferably ranges from $5 \times 10^{14}$ atoms/cm$^2$ to $1 \times 10^{15}$ atoms/cm$^2$.

Subsequently, the ion-implanted phosphorous is activated through a lamp annealing at 1000 degrees in centigrade for 30 seconds. The crystal defect is partially cured during the lamp annealing, and a heavily doped n-type buried layer 44 is formed in the heavily doped n-type dopant impurity layer. However, the crystal defect is not perfectly cured under the annealing conditions, and, for this reason, is left so as to form a gettering site layer 45 as shown in FIG. 4C. Thus, the heavily doped n-type buried layer 44 and the gettering site layer 45 are concurrently formed under the n-type active layer 43.

The annealing conditions are variable depending upon the heavily doped dopant impurity layer, and are never limited to the above described values in so far as the crystal defect is imperfectly cured during the annealing. The annealing conditions will be discussed hereinlater in detail.

Figure 5:
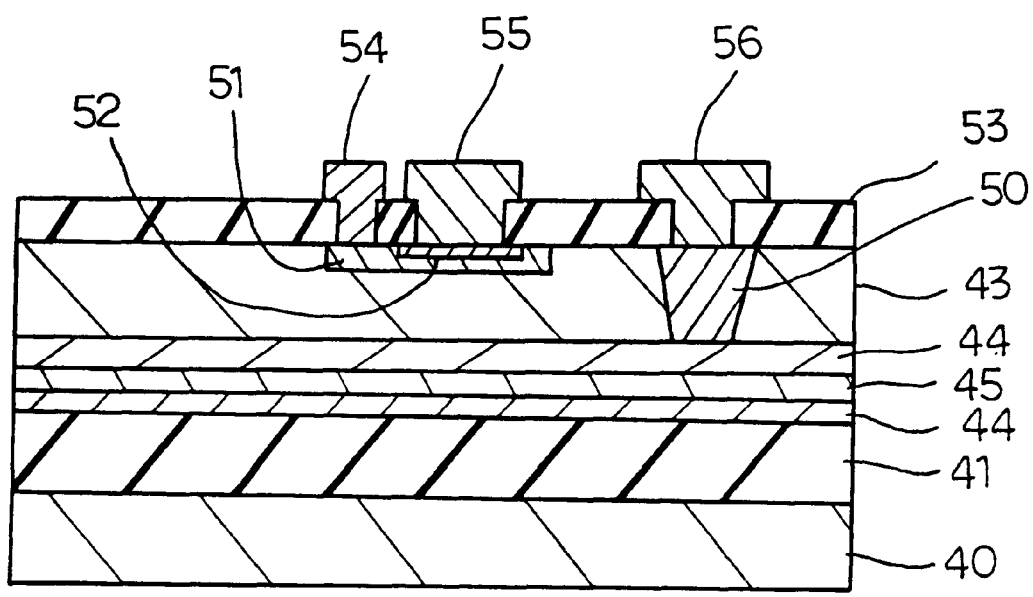
FIG. 5 is a cross sectional view showing a bipolar transistor fabricated on a substrate fabricated through the process shown in FIGS. 4A to 4C.

Using the SOI substrate shown in FIG. 4C, an n-p-n type bipolar transistor (see FIG. 5) is fabricated as follows. A heavily doped n-type collector contact region 50 is formed in the n-type active layer 43. The heavily doped n-type collector contact region 50 penetrates through the n-type active layer 43, and is merged into the heavily doped n-type buried layer 44.

A suitable ion-implantation mask is formed on the n-type active layer 43, and p-type dopant impurity such as boron is lightly ion implanted into the n-type active layer 43. The p-type dopant impurity forms a base region 51 in the n-type active layer 43.

Subsequently, the base region 51 is covered with another ion-implantation mask, and a central area of the base region 51 is exposed to a window of the ion-implantation mask. N-type dopant impurity is heavily ion implanted into the central area of the base region 51, and forms an n-type emitter region 52. The n-type emitter region 52 is nested in the p-type base region 51.

Contact windows are formed in an insulating layer 53 through the lithographic techniques, and the p-type base region 51, the emitter region 52 and the collector contact region 50 are exposed to the contact windows. A base electrode 54, an emitter electrode 55 and a collector electrode 56 are patterned so as to be held in contact with the p-type base region 51, the emitter region 52 and the collector contact region 50, respectively.

As will be understood from the foregoing description, the dopant concentration of phosphorous ion is maximized in the n-type single crystal silicon substrate 42, and the dopant impurity of buried layer 44 is much enough to decrease the resistivity.

Moreover, the buried layer 44 and the gettering site layer 45 are concurrently formed through the lamp annealing, and the gettering site layer is sufficiently spaced from the n-type active layer 43. For this reason, even if a p-n junction such as a base-collector junction is formed in the n-type active layer 43, the gettering layer 45 does not affect the p-n junction, and the amount of leakage current through the p-n junction is small. The buried layer 44 and the gettering site layer 45 are concurrently formed through the ion-implantation and the annealing, and the concurrent formation makes the process simple.

The present inventor confirmed evaluated the crystal structure around the base-collector junction. The present inventor formed a bipolar transistor in the n-type active layer 43, and measured leakage current across the base-collector junction. The present inventor confirmed that the SOI substrate according to the present invention reduced the leakage current at 20 percent.

Second Embodiment

Figure 6A:
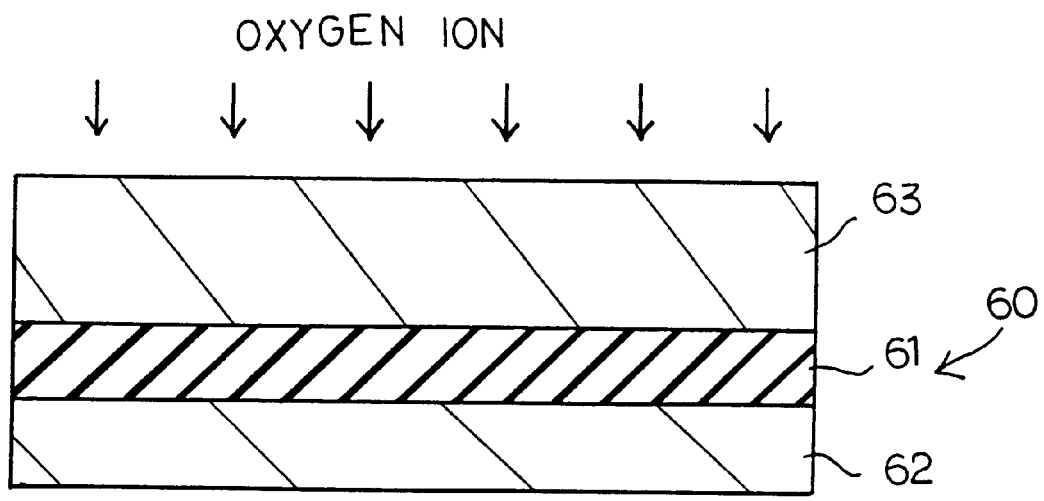
FIGS. 6A and 6B are cross sectional views showing another process of fabricating a semiconductor device according to the present invention.
Figure 6B:
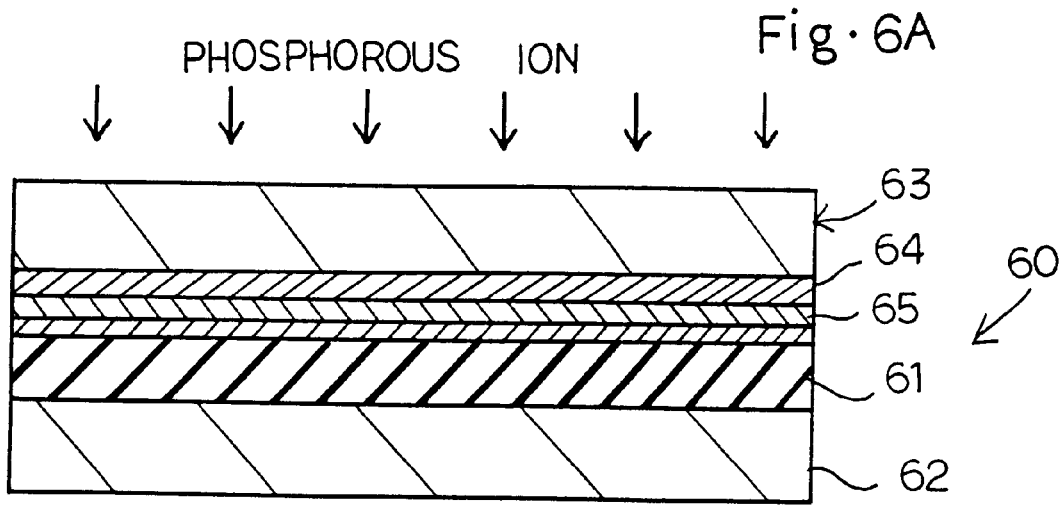

FIGS. 6A and 6B illustrate another process embodying the present invention. The starting material is a single crystal silicon substrate 60. Oxygen ion is implanted into the single crystal silicon substrate 60 at dosage of $5 \times 10^{17}$ cm$^{-2}$, and the single crystal silicon substrate 60 is treated with heat at 1300 degrees in centigrade for 6 hours. Then, a silicon oxide layer 61 is formed in the single crystal silicon substrate 60, and single crystal silicon layers 62 and 63 are left under and over the silicon oxide layer 61 as shown in FIG. 6A. Thus, an SOI substrate is prepared.

Subsequently, phosphorous ion is implanted into the single crystal silicon layer 63 in such a manner that the phosphorous concentration is maximized in the single crystal silicon layer 63. If the dosage is less than $1 \times 10^{14}$ atoms/cm$^2$, crystal defect insufficiently occurs in the single crystalline silicon layer 63. For this reason, the dosage is $5 \times 10^{14}$ atoms/cm$^2$.

Subsequently, the resultant structure is subjected to a lamp annealing at 1000 degrees in centigrade for 30 seconds. The ion-implanted phosphorous is activated, and the crystal defect is partially cured. As a result, a heavily-doped n-type buried layer 64 and a gettering site layer 65 are concurrently formed in the single crystalline silicon layer 63 as shown in FIG. 6B.

As will be appreciated from the foregoing description, the heavily-doped n-type buried layer 64 and the gettering site layer 64 are concurrently formed through the ion-implantation and the annealing, and the process sequence is simpler than the third prior art process. The heavily doped n-type buried layer 64 is formed at the depth where the phosphorous concentration is maximized. For this reason, the heavily doped n-type buried layer 64 is low in resistivity. Finally, the heavily-doped n-type buried layer 64 spaces the single crystal silicon layer 63 from the gettering site layer 65, and the gettering site layer 65 does not seriously affect the characteristics of a circuit component formed in the single crystal silicon layer 63.

The present inventor investigated the annealing conditions available for the process according to the present invention. First, the present inventor determined the lower temperature limit. When the annealing temperature was lower than 900 degrees in centigrade, the activation of ion-implanted impurity required more than 100 seconds, and such long annealing period was undesirable for the commercial process, and the present inventor determined the lower limit at 900 degrees in centigrade. On the other hand, when the annealing temperature was higher than 120 degrees in centigrade, the crystal defect was rapidly cured, and getting site layer 45 was hardly controlled. For this reason, the present inventor determined the upper limit at 1200 degrees in centigrade.

Figure 7:
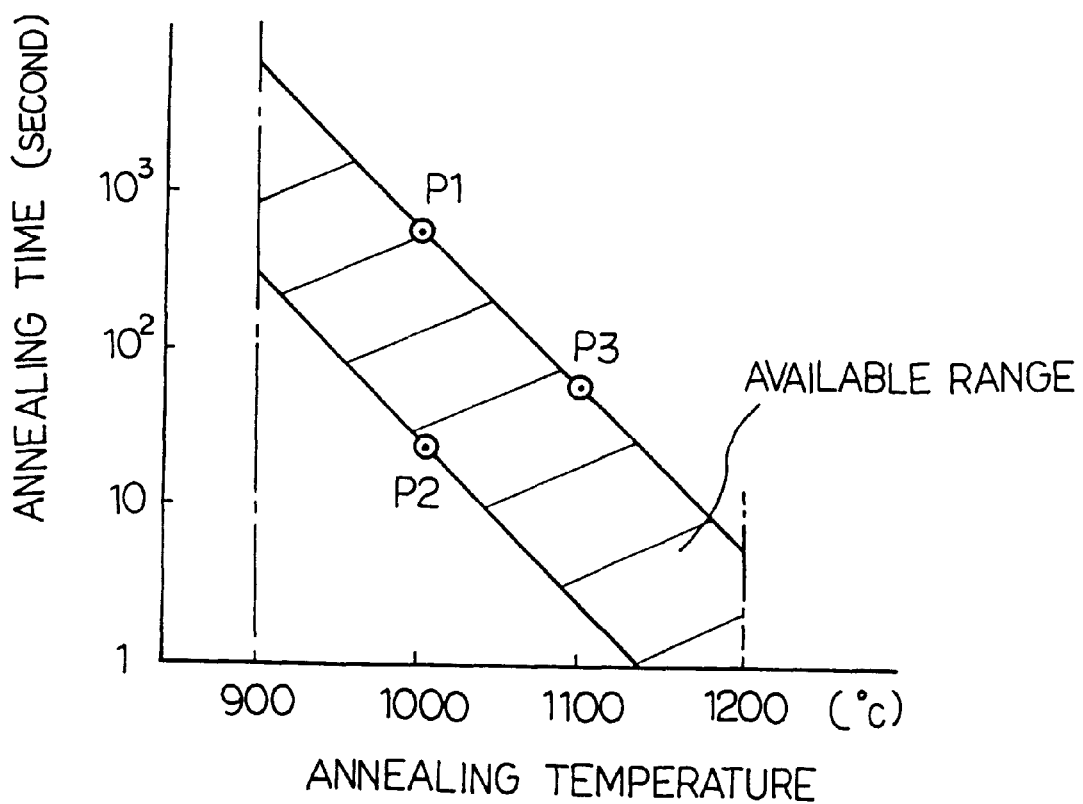
FIG. 7 is a graph showing annealing conditions available for the process according to the present invention.

The annealing time was determined from the aspect of sufficient activation of dopant impurity and the controllability of the gettering site layer 45. When the annealing temperature was 1000 degrees in centigrade, the gettering site layer 45 was lost after 600 seconds (see P1 in FIG. 7), and the ion-implanted dopant impurity was imperfectly activated through the annealing shorter than 20 seconds (see P2). When the annealing temperature was 1100 degrees in centigrade, the gettering site layer was lost after the 60 seconds (see P3). Though not shown in FIG. 7, the shortest annealing time and the longest annealing time were determined for each annealing temperature between 900 degrees in centigrade and 1200 degrees in cetigrade. Thus, the annealing conditions were expressed by the hatched region in FIG. 7.

Although particular embodiments of the present invention have been shown and described, it will be obvious to those skilled in the art that various changes and modifications may be made without departing from the spirit and scope of the present invention.

For example, a p-type single crystalline silicon substrate may be used for the SOI substrate according to the present invention. In this instance, n-type dopant impurity may be ion implanted. Examples of the n-type dopant impurity are phosphorous and arsenic, and an example of the p-type dopant impurity is boron.

What is claimed is:

1. A process of fabricating a semiconductor device, comprising the steps of:
    a) preparing a semiconductor structure having an insulating layer sandwiched between a first semiconductor layer and a second semiconductor layer;
    b) implanting dopant impurity ions into said semiconductor structure at dosage not less than $1 \times 10^{14}$ atoms/cm$^2$ under the conditions that the concentration of said dopant impurity is maximized in said first semiconductor layer so as to form a heavily-doped damaged layer therein; and
    c) partially annealing said heavily doped damaged layer so as to concurrently form a heavily doped semiconductor layer and a gettering site layer different in depth from said heavily-doped semiconductor layer in said first semiconductor layer.

2. The process as set forth in claim 1, in which said dopant impurity ion is implanted into said first semiconductor layer at a certain dosage equal to or greater than $1 \times 10^{14}$ atoms/cm$^2$.

3. The process as set forth in claim 2, in which said certain dosage ranges from $1 \times 10^{14}$ atoms/cm$^2$ to $1 \times 10^{16}$ atoms/cm$^2$.

4. The process as set forth in claim 2, in which said certain dosage ranges from $5 \times 10^{14}$ atoms/cm$^2$ to $1 \times 10^{15}$ atoms/cm$^2$.

5. The process as set forth in claim 4, in which said dopant impurity ion at said certain dosage forms a conductive buried layer.

6. The process as set forth in claim 1, in which said step a) includes the sub-steps of
    a-1) preparing a semiconductor substrate,
    a-2) forming said insulating layer on said first semiconductor substrate so as to laminate said insulating layer on said second semiconductor layer, and a-3) bonding said first semiconductor layer to said insulating layer.

7. The process as set forth in claim 6, in which said semiconductor substrate is formed of single crystalline silicon, and said insulating layer and said second semiconductor layer are formed of silicon oxide and single crystalline silicon, respectively.

8. The process as set forth in claim 1, in which said step a) includes the sub-steps of a-1) preparing a semiconductor substrate, a-2) implanting oxygen ion into said semiconductor substrate under a certain acceleration energy to have the maximum dopant concentration at an intermediate depth, and a-3) treating the resultant structure at said step a-2) with heat so that said oxygen ion reacts with the semiconductor material of said semiconductor substrate, thereby forming said semiconductor structure.

9. A process of fabricating a semiconductor device, comprising the steps of:

a) preparing a first substrate of single crystalline silicon;

b) forming a silicon oxide layer on said single crystalline silicon;

c) bonding a second substrate of single crystalline silicon to said silicon oxide layer;

d) implanting dopant impurity ions into said another layer at a certain dosage between $1 \times 10^{14}$ atoms/cm$^2$ and $1 \times 10^{16}$ atoms/cm$^2$ under the conditions that the concentration of said dopant impurity ions is maximized in said single crystalline silicon of said first substrate, thereby forming a heavily-doped damaged layer in said single crystalline silicon of said first substrate; and e) partially annealing said heavily doped damaged layer so as to concurrently form a heavily doped semiconductor layer and a gettering site layer different in depth from said heavily-doped semiconductor layer.

10. A process of fabricating a semiconductor device, comprising the steps of:

a) preparing a single crystalline silicon substrate, b) implanting oxygen ions into said single crystalline silicone substrate under a certain acceleration energy to have the maximum dopant concentration at an intermediate depth;

c) treating the resultant structure at said step b) with heat so that said oxygen ions react with the silicon of said single crystalline silicon substrate, thereby forming a silicon oxide layer sandwiched between a first silicon layer and a second silicon layer;

d) implanting dopant impurity ions into said another layer at a certain dosage equal to or greater than $1 \times 10^{14}$ atoms/cm$^2$ under the conditions that the concentration of said dopant impurity ions is maximized in said first silicon layer, thereby forming a heavily-doped damaged layer in said first silicon layer; and e) partially annealing said heavily doped damaged layer so as to concurrently form a heavily doped silicon layer and a gettering site layer different in depth from said heavily-doped semiconductor layer in said first silicon layer.

* * * * *